United States Patent [19]
Prchal

[11] Patent Number: 5,825,631
[45] Date of Patent: Oct. 20, 1998

[54] METHOD FOR CONNECTING TWO SUBSTRATES IN A THICK FILM HYBRID CIRCUIT

[75] Inventor: Dave Prchal, Hopkins, Minn.

[73] Assignee: Starkey Laboratories, Eden Praire, Minn.

[21] Appl. No.: 839,880

[22] Filed: Apr. 16, 1997

[51] Int. Cl.[6] .................................. H05F 1/11; H01R 9/09
[52] U.S. Cl. ......................... 361/790; 361/742; 361/803; 361/804; 439/69; 439/74; 439/91
[58] Field of Search ...................................... 361/790, 742, 361/758, 770, 803, 804; 439/69, 74, 91

[56] References Cited

U.S. PATENT DOCUMENTS

| | | | |
|---|---|---|---|
| 4,203,203 | 5/1980 | Gilissen et al. | 439/91 |
| 4,421,370 | 12/1983 | Treakle et al. | 439/91 |
| 5,013,249 | 5/1991 | Lindeman et al. | 439/69 |
| 5,130,894 | 7/1992 | Miller | 361/803 |
| 5,147,207 | 9/1992 | Mowry | 439/74 |
| 5,426,563 | 6/1995 | Moresco et al. | 361/790 |
| 5,491,303 | 2/1996 | Weiss | 439/74 |
| 5,536,177 | 7/1996 | Casey | 439/74 |

*Primary Examiner*—Leo P. Picard
*Assistant Examiner*—John B. Vigushin
*Attorney, Agent, or Firm*—Jay H. Maioli

[57] ABSTRACT

Two hybrid circuit components are connected to one another by a ceramic block. Electrical connections are made between the hybrid components by conductive vias through the ceramic block. The ceramic block is disposed toward an edge of the hybrid components so that integrated circuits and/or discrete electrical components may be attached to a major portion of both surfaces of each hybrid substrate. The interconnected hybrid components form a compact electrical device, for example, a hearing aid.

11 Claims, 5 Drawing Sheets

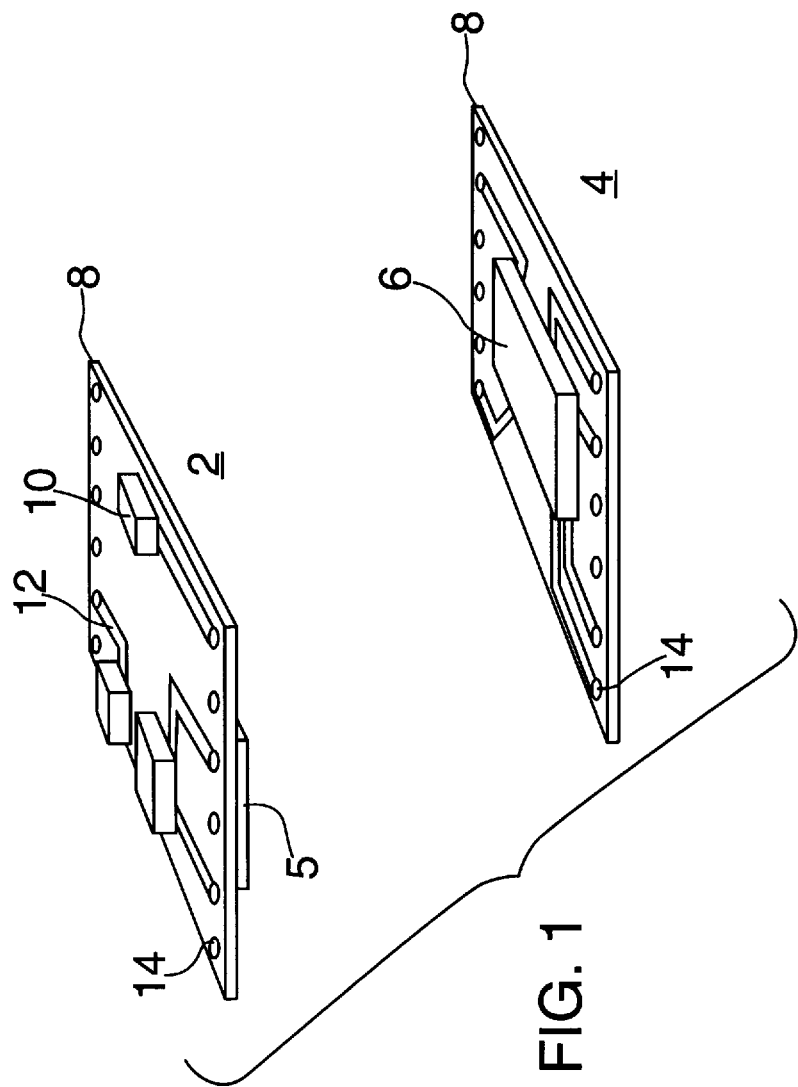

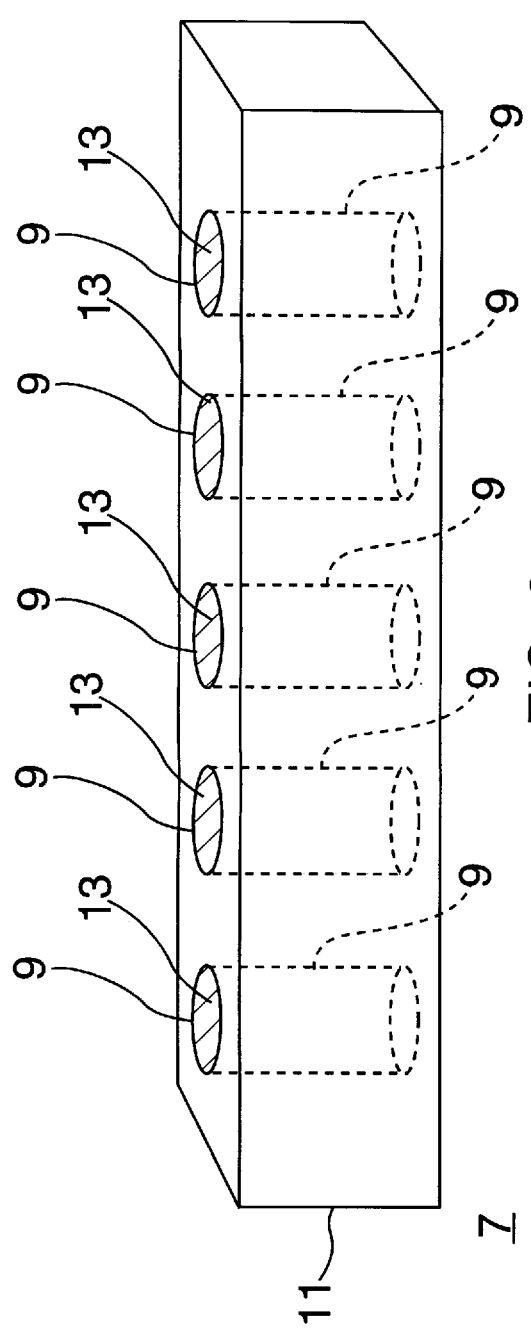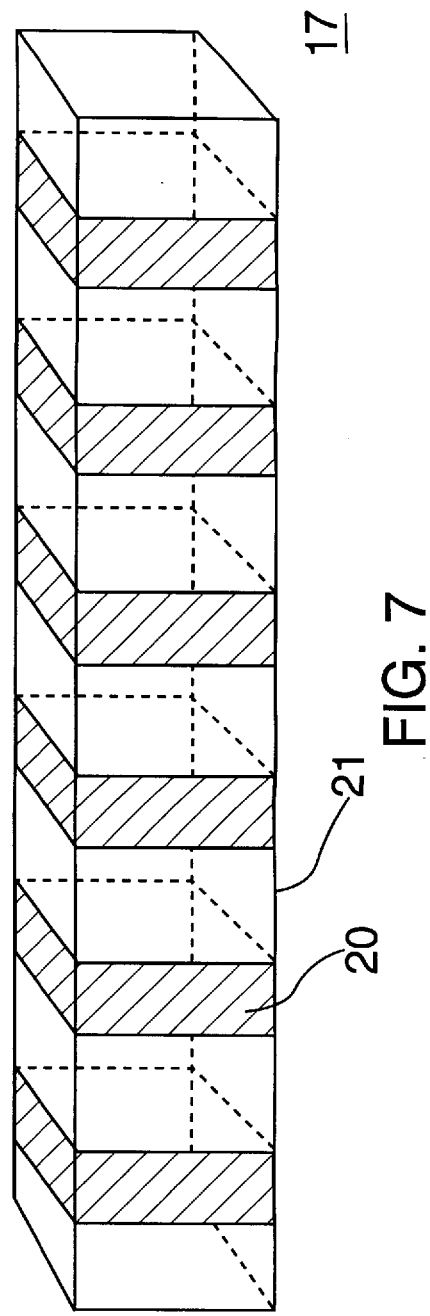

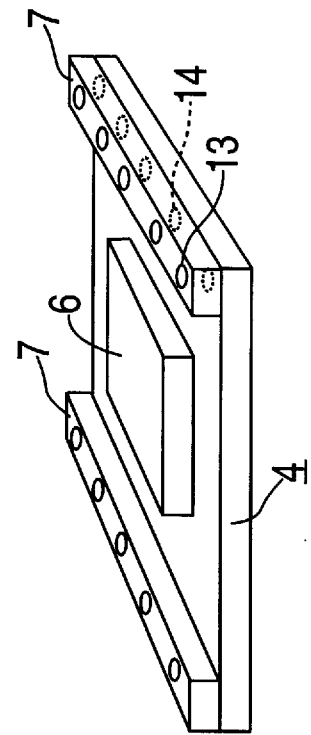
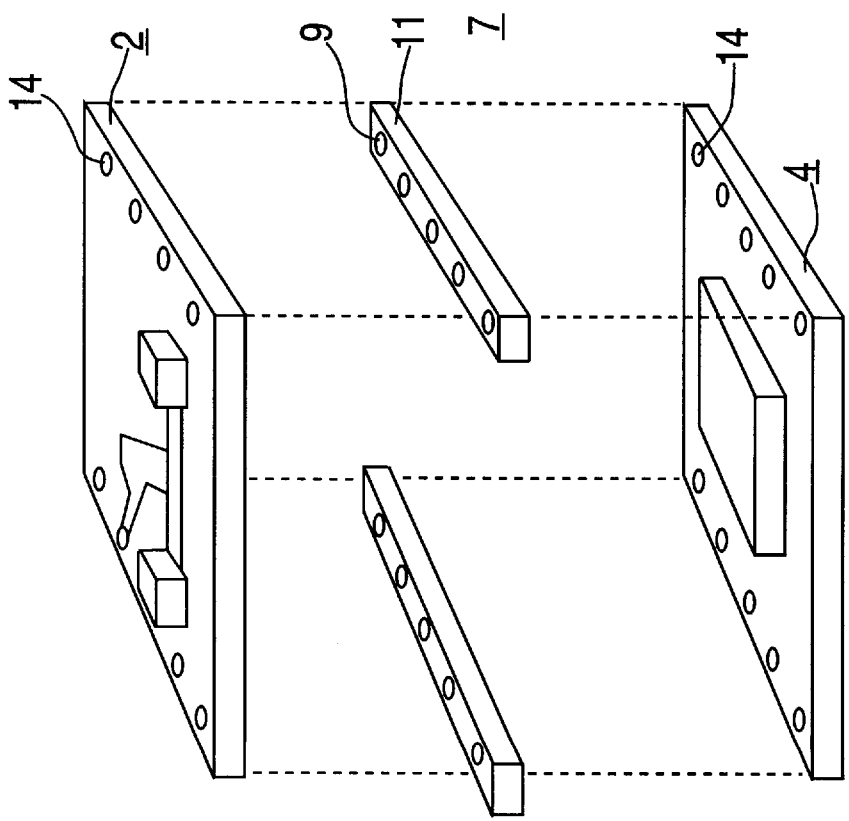

METHOD FOR CONNECTING TWO SUBSTRATES IN A THICK FILM HYBRID CIRCUIT

BACKGROUND OF THE INVENTION

1. Field of the Invention

This invention relates generally to the field of interconnection devices for mechanically and electrically interconnecting thick-film hybrid circuits on separate substrates. In particular, this invention relates to an interconnection device for connecting two hybrid circuits disposed on two separate substrates where electrical components can the accommodated on both sides of each substrate.

2. Description of Related Art

Developments in digital signal processing have resulted in significant improvements in the performance of hearing aids. This has lead to a demand for increasingly complex circuitry, including both analog and digital components. The overall size of the hearing aid, however, is constrained by the requirement that it fit indistinguishably into the human ear canal. As a result, there is a need to provide a compact means of interconnecting a variety of circuit components.

In applications where the overall size of a device must be limited, hybrid circuits are used to incorporate solidstate devices with discrete components. Such circuits typically incorporate one or more integrated circuits with thick film resistors, capacitors, and contact pads on a ceramic substrate. Components are interconnected using printed conductors. Where components are placed on both sides of the substrate vias are provided.

The number of devices that can be accommodated on a single substrate is limited by the size of the components and the need to isolate signal paths from one another. In some cases multiple hybrid substrates must be interconnected to provide a large enough surface area to accommodate a complete circuit.

Known methods of connecting hybrid circuits with one another generally require that the circuits be mounted to a card containing lines and vias for providing circuit paths from one device to another. This card is often composed of a polymer material with a low modulus of elasticity to accommodate differential thermal expansion of the hybrid circuit substrates.

U.S. Pat. No. 5,347,091 (Schroeder) proposes an alternative to polymer interconnect cards. Schroeder discloses a ceramic laminate interconnect card where the thermal expansion characteristics of the card match those of the attached hybrid substrates.

Interconnection of hybrid circuits using a card as disclosed in Schroeder suffers from the drawback that one surface of each hybrid circuit must be mounted flush to the surface of the card. As a result, components may be mounted to only one side of each hybrid substrate. This loss of usable surface area increases the number of substrates required to accommodate the circuit and increases the size of the resulting device.

OBJECTS AND SUMMARY OF THE INVENTION

In view of the problem described above, it is an object of the present invention to provide an interconnection apparatus for joining two hybrid circuit modules where electronic components may be accommodated on both surfaces of each substrate.

It is another object of the present invention to provide an interconnection apparatus whereby connections between hybrid circuits can be made reliably, using known placement and soldering technology.

It is a further object of the present invention to provide a hybrid circuit connector that allows the construction of compact, mechanically sound components.

According to an aspect of the present invention two hybrid circuits are constructed on ceramic substrates. Along at least one edge of each substrate are disposed interconnection pads. A rectangular ceramic block is provided with through holes. These through holes are filled with a conductive material. The holes of the ceramic block are aligned with the interconnection pads on each substrate and the conductive material within the holes is reflow soldered or conductive epoxied to the interconnection pads. The device is then encapsulated and incorporated into a completed device.

BRIEF DESCRIPTION OF THE DRAWINGS

FIG. 1 shows two thick-film hybrid circuits according to an embodiment of the present invention.

FIG. 2 shows an interconnection block used with the hybrid circuits shown in FIG. 1.

FIG. 3 shows hybrid circuits and two interconnection blocks aligned with one another according to the embodiment of the present invention.

FIG. 4 shows a hybrid circuit with attached interconnection blocks according to the embodiment of the present invention.

FIG. 7 shows an alternative method of constructing interconnection blocks according to the embodiment of the present invention.

DETAILED DESCRIPTION OF THE PREFERRED EMBODIMENTS

Figure 5:
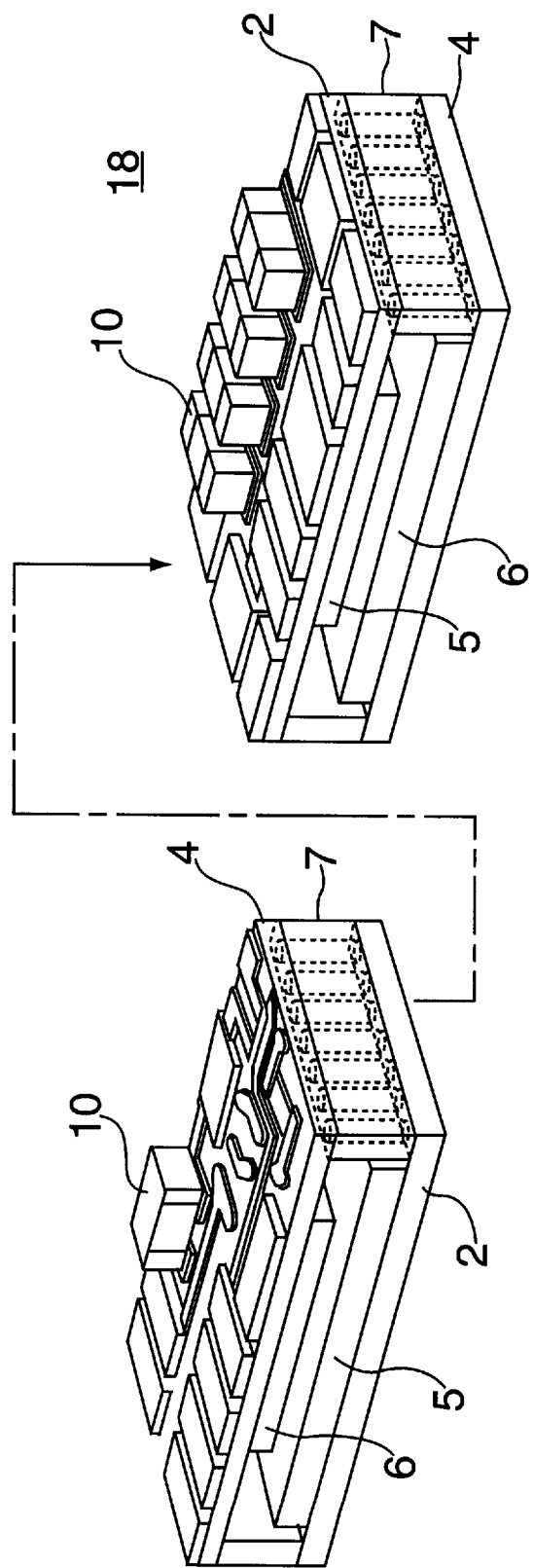
FIG. 5 shows two thick-film hybrid circuits connected to one another according to the embodiment of the present invention.

FIG. 1 shows two hybrid circuit components 2,4 used in an embodiment of the present invention. Hybrid component 2 includes an integrated circuit chip 5 affixed to one surface of a ceramic substrate 8. On the opposite surface of the substrate 8 are affixed thick-film hybrid circuit elements 10 and conductors 12. Along the edge of the substrate 8 are conductive vias 14 that connect the two surfaces of the substrate 8 electrically. Conductors (not shown) on the lower surface of the substrate 8 connect the integrated circuit 5 with the thick-film hybrid elements 10 and conductors 12 through the vias 14 forming the hybrid component 2.

Hybrid circuit component 4 is formed in the same manner as component 2. Vias 14 on component 4 are positioned to align with vias 14 on component 2 when the circuits are aligned face-to-face. The electrical circuits formed on the hybrid components 2, 4 when electrical connections are formed between aligned vias 14 constitute an operational electrical device, for example, a hearing aid.

FIG. 2 shows an interconnection block 7. A rectangular ceramic block 11 is provided with through holes 9. The holes 9 are filled with a conductive material 13. The holes 9 are spaced along the ceramic block 11 to align with pads 14 formed on the hybrid components 2, 4 as shown in FIG. 3.

FIG. 4 shows two interconnect blocks 7 affixed to a hybrid circuit component 4. The interconnect blocks 7 are reflow soldered to or conductive epoxied the vias 14 using a known technique to bond the conductive material 13 with the vias 14. The interconnect blocks 7 are disposed along the edge of the substrate 8 leaving the surface of the substrate 8 substantially free to accommodate the integrated circuit chip 6.

The other circuit component 2 is then aligned with the interconnection blocks 7, as shown in FIG. 5. Again, only the edges of circuit component 2 are covered with the interconnection blocks 7 leaving each surface of the hybrid component 2 substantially free to accommodate an integrated circuit chip 5 and discreet components 10. The assembly 18 is again reflow soldered or conductive epoxied to bond the conductive material 9 with the vias 14 of circuit component 2.

Figure 6:
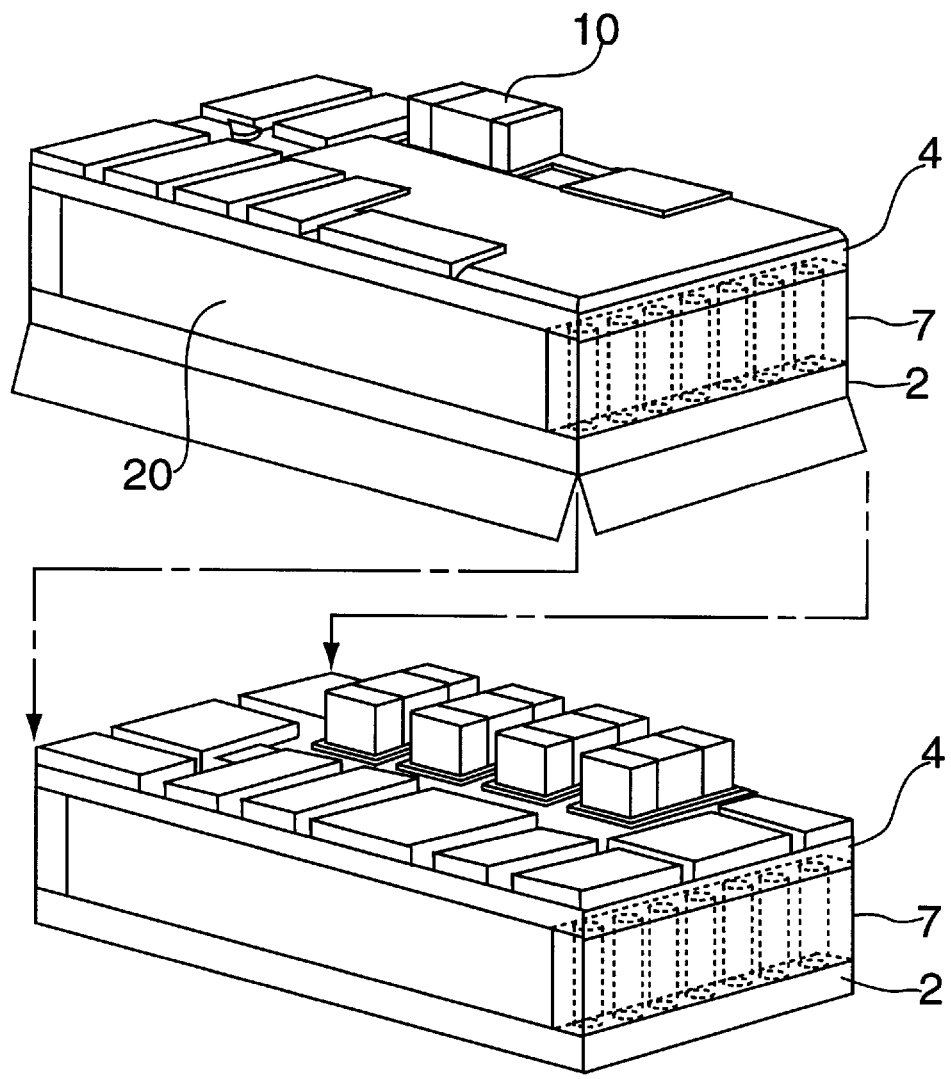
FIG. 6 shows a completed device according to the embodiment of the present invention.

The assembly 18 is then connected with external components (not shown) and encapsulated with epoxy 20, as shown in FIG. 6, forming the completed device.

FIG. 7 shows an alternative method of forming interconnection blocks 17. A rectangular ceramic block 21 is coated with a conductive material 20 in bands along three sides of the ceramic block 21. The positions of the bands 20 is selected to align with the vias 14 of the hybrid circuit components 2,4 described above. Conductive bands 20 of interconnection block 17 are then connected with vias 14 of hybrid components 2, 4 as described above.

The embodiment described above is an illustrative example of the present invention. It should be understood that the present invention is not limited to this particular embodiment. Various changes may be effected by one skilled in the art without departing from the spirit or scope of the invention as defined in the appended claims.

What is claimed is:

1. An electronic device formed from a plurality of interconnected hybrid electronic circuits, comprising:

a first substrate;

a plurality of first electronic components disposed on a first side and on a second side of the first substrate forming a first hybrid circuit, the first electronic components on the first side of the first substrate being less than a first predetermined height;

a first set of interconnect points disposed on the first side of the first substrate and electrically connected with the first hybrid circuit;

a second substrate;

a plurality of second electronic components disposed on at least a first side of the second substrate forming a second hybrid circuit, the second electronic components on the first side of the second substrate being less than a second predetermined height;

a second set of interconnect points disposed on the first side of the second substrate and electrically connected with the second hybrid circuit;

a ceramic block disposed between the first sides of the first and second substrates, a thickness of the ceramic block being greater than a sum of the first and second predetermined heights, the ceramic block covering less than a total area of the first sides of the first and second substrates, so that the first sides are substantially free to accommodate the first and second electronic components;

a plurality of passages being disposed through the ceramic block, the passages being aligned with the first and second sets of interconnection points; and conductive material disposed in the plurality of passages, whereby a plurality of conductive paths are formed between the first and second set of interconnection points, whereby the interconnected first and second hybrid circuits form the electronic device.

2. The electronic device according to claim 1 wherein the ceramic block is disposed toward peripheral edges of the first and second substrates.

3. The electronic device according to claim 1 wherein the first and second substrates are composed of a ceramic material.

4. The electronic device according to claim 1 wherein the first and second hybrid circuits include thick-film components.

5. The electronic device according to claim 1 wherein the first and second hybrid circuits form components of a hearing aid.

6. An interconnection module for electrically and mechanically joining two or more hybrid electronic circuits, comprising:

a ceramic block;

a plurality of holes provided through the ceramic block;

a conductive material disposed within the plurality of holes;

a plurality of interconnection points provided on said hybrid electronic circuits, said interconnection points disposed on each hybrid circuit in alignment with said holes in said ceramic block;

bonding means for bonding said conductive material with said interconnection points; and encapsulating material for filling a space between the joined hybrid circuits and for encasing the hybrid circuits and ceramic block, whereby the joined hybrid circuits form a monolithic component.

7. The interconnection module according to claim 6 wherein said interconnection points are disposed proximate to peripheral edges of said hybrid circuits.

8. The interconnection module according to claim 6 wherein said bonding means is a solder joint formed by a reflow solder technique, or conductive epoxy joint formed by a conductive epoxy attachment technique.

9. A method for mechanically and electrically connecting two or more hybrid electronic circuits comprising the steps of:

forming a first hybrid circuit and a first substrate, said first hybrid circuit including a first plurality of contact points;

forming a ceramic interconnection block;

bonding said interconnection block to said first plurality of contact points;

forming a second hybrid circuit and a second substrate, said second hybrid circuit including a second plurality of contact points;

bonding said interconnection block to said second plurality of contact points; and encapsulating the first and second hybrid circuits and the interconnection block to form a monolithic component.

10. The method according to claim 9 wherein the step of forming said interconnect block includes the steps of:

forming a rectangular ceramic blank;

forming a plurality of holes through said ceramic blank, said holes distributed in a pattern corresponding to a pattern of said connection points; and depositing a conductive material within said plurality of holes.

11. A method for mechanically and electrically connecting two or more hybrid electronic circuits comprising the steps of:

forming a first hybrid circuit and a first substrate, said first hybrid circuit including a first plurality of contact points;

forming a ceramic rectangular blank;

printing a plurality of conductive bands around three sides of said blank to form an interconnection block, a spacing of said bands corresponding to a spacing of said contact points;

bonding said conductive bands of said interconnection block to said first plurality of contact points;

forming a second hybrid circuit and a second substrate, said second hybrid circuit including a second plurality of contact points; and bonding said conductive bands of said interconnection block to said second plurality of contact points.

* * * * *